(12) United States Patent
Campbell et al.

(10) Patent No.: US 11,948,781 B2
(45) Date of Patent: Apr. 2, 2024

(54) APPARATUS AND SYSTEM INCLUDING HIGH ANGLE EXTRACTION OPTICS

(71) Applicant: Applied Materials, Inc., Santa Clara, CA (US)

(72) Inventors: Christopher Campbell, Newburyport, MA (US); Costel Biloiu, Rockport, MA (US); Peter F. Kurunczi, Cambridge, MA (US); Jay R. Wallace, Danvers, MA (US); Kevin M. Daniels, Lynnfield, MA (US); Kevin T. Ryan, Wilmington, MA (US); Minab B. Teferi, Gloucester, MA (US); Frank Sinclair, Boston, MA (US); Joseph C. Olson, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 447 days.

(21) Appl. No.: 17/160,042

(22) Filed: Jan. 27, 2021

(65) Prior Publication Data
US 2021/0391155 A1   Dec. 16, 2021

Related U.S. Application Data

(60) Provisional application No. 63/039,760, filed on Jun. 16, 2020.

(51) Int. Cl.
*H01J 37/32* (2006.01)

(52) U.S. Cl.
CPC .. *H01J 37/32788* (2013.01); *H01J 37/32568* (2013.01)

(58) Field of Classification Search
CPC .......... H01J 37/32541; H01J 37/08; H01J 37/32422; H01J 37/3255; H01J 37/3053; H01J 2237/061
See application file for complete search history.

(56) References Cited

U.S. PATENT DOCUMENTS

| 9,514,912 B2 * | 12/2016 | Biloiu | ............ H01J 37/08 |
| 11,056,319 B2 * | 7/2021 | Biloiu | ............ H01J 37/3255 |

(Continued)

FOREIGN PATENT DOCUMENTS

| JP | 2015019064 A | 1/2015 |
| JP | 2016081753 A | 5/2016 |

(Continued)

OTHER PUBLICATIONS

International Search Report and Written Opinion dated Jan. 7, 2022, for the International Patent Application No. PCT/US2021/051002, filed on Sep. 18, 2021, 9 pages.

(Continued)

*Primary Examiner* — David A Vanore
(74) *Attorney, Agent, or Firm* — KDW Firm PLLC

(57) ABSTRACT

A processing system may include a plasma chamber operable to generate a plasma, and an extraction assembly, arranged along a side of the plasma chamber. The extraction assembly may include an extraction plate including an extraction aperture, the extraction plate having a non-planar shape, and generating an extracted ion beam at a high angle of incidence with respect to a perpendicular to a plane of a substrate, when the plane of the substrate is arranged parallel to the side of the plasma chamber.

20 Claims, 6 Drawing Sheets

(56) References Cited

U.S. PATENT DOCUMENTS

| | | | |
|---|---|---|---|
| 2012/0104274 A1* | 5/2012 | Hirayanagi | H01J 37/08 |
| | | | 250/424 |
| 2015/0255243 A1 | 9/2015 | Godet | |
| 2016/0189935 A1* | 6/2016 | Biloiu | H01J 37/32532 |
| | | | 250/423 R |
| 2016/0333464 A1* | 11/2016 | Likhanskii | C23C 14/221 |
| 2017/0032927 A1* | 2/2017 | Koo | H01J 27/024 |
| 2021/0035779 A1* | 2/2021 | Biloiu | H01J 37/3053 |
| 2021/0391155 A1* | 12/2021 | Campbell | H01J 37/32788 |
| 2022/0148843 A1* | 5/2022 | Biloiu | H01J 37/32559 |

FOREIGN PATENT DOCUMENTS

| | | |
|---|---|---|
| TW | 201705187 A | 2/2017 |
| WO | 2020117939 A1 | 6/2020 |

OTHER PUBLICATIONS

International Search Report and Written Opinion dated Sep. 17, 2021, for the International Patent Application No. PCT/US2021/032727, filed on May 17, 2021, 9 pages.

* cited by examiner

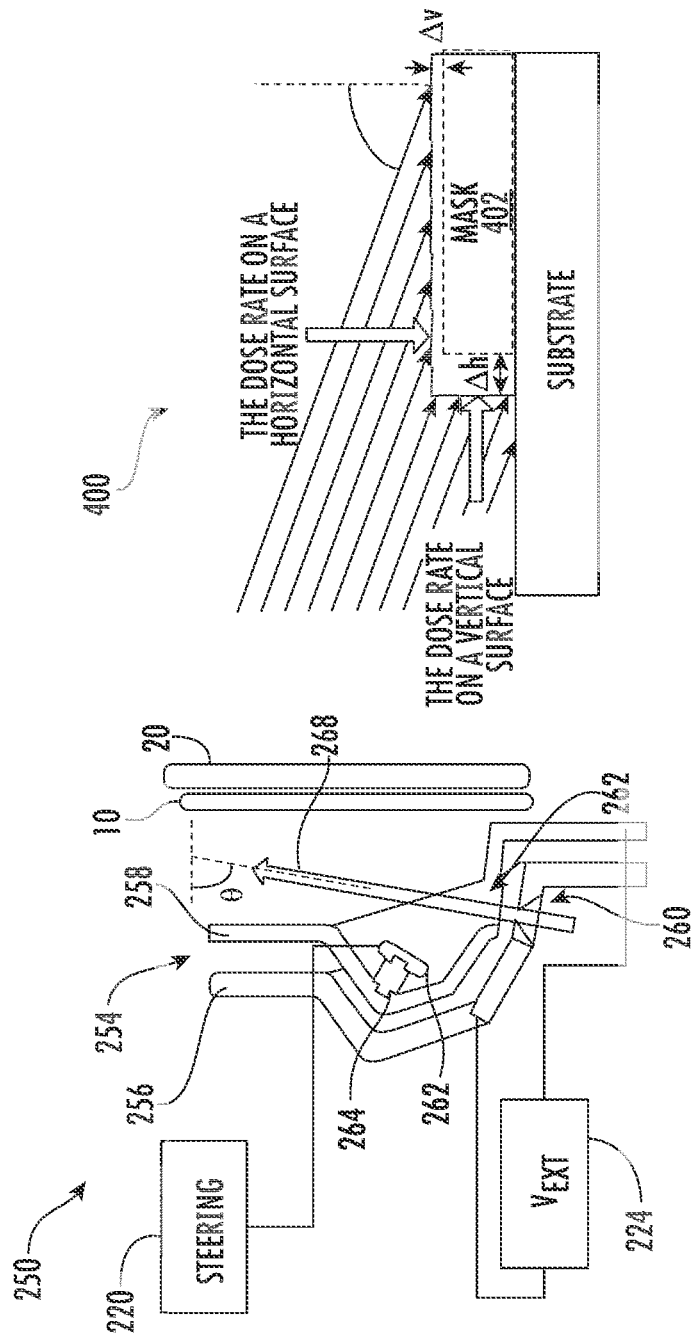

APPARATUS AND SYSTEM INCLUDING HIGH ANGLE EXTRACTION OPTICS

This application claims priority to U.S. provisional patent application No. 63/039,760, filed Jun. 16, 2020, entitled APPARATUS AND SYSTEM INCLUDING HIGH ANGLE EXTRACTION OPTICS, and incorporated by reference herein in its entirety.

FIELD OF THE DISCLOSURE

The present embodiments relate to a processing apparatus, and more particularly, to an apparatus enabling ion extraction from a plasma at high on-substrate incidence angle.

BACKGROUND OF THE DISCLOSURE

Known apparatus used to treat substrates with ions include beamline ion implanters and plasma immersion ion implantation tools. These approaches are useful for treating substrates with ions over a range of energies. In beamline ion implanters, ions are extracted from a source, mass analyzed and then transported to the substrate surface. In plasma immersion ion implantation apparatus, a substrate is located in the same chamber while the plasma is generated adjacent to the plasma. The substrate is set at negative potential with respect to the plasma, and ions crossing the plasma sheath in front of the substrate may impinge on the substrate at a perpendicular incidence angle.

Many of such approaches employ perpendicular incidence on a substrate or wafer, while other applications employ angled etching such as controlled etching of trench sidewalls, hole elongation, photoresist shrinking, and magnetic random memory structures etching, where ion beams are defined by a non-zero mean angle of incidence with respect to the perpendicular to the substrate. Control of such processes may be more difficult than control of ion beam processing at normal incidence.

It is with respect to these and other considerations, the present disclosure is provided.

SUMMARY

In one embodiment, a processing system is provided. The processing system may include a plasma chamber operable to generate a plasma, and an extraction assembly, arranged along a side of the plasma chamber. The extraction assembly may include an extraction plate including an extraction aperture, the extraction plate having a non-planar shape, and generating an extracted ion beam at a high angle of incidence with respect to a perpendicular to a plane of a substrate, when the plane of the substrate is arranged parallel to the side of the plasma chamber.

In another embodiment, an extraction assembly is provided for directing an angled ion beam to a substrate. The extraction assembly may include an extraction plate, comprising a peripheral portion to couple to a side of a plasma chamber, and a central portion. The central portion may have a non-planar shape, and may include an elongated extraction aperture arranged to generate an extracted ion beam at a high angle of incidence with respect to a perpendicular to a plane of the substrate, when the plane of the substrate is arranged parallel to the side of the plasma chamber.

BRIEF DESCRIPTION OF THE DRAWINGS

The accompanying drawings illustrate exemplary approaches of the disclosed embodiments so far devised for the practical application of the principles thereof.

FIG. 7 shows a block diagram of one additional processing apparatus including another high angle extraction assembly in accordance with various embodiments of the disclosure; and FIG. 8 shows the geometry of high angle of incidence treatment of a surface feature by an ion beam.

Figure 1A:
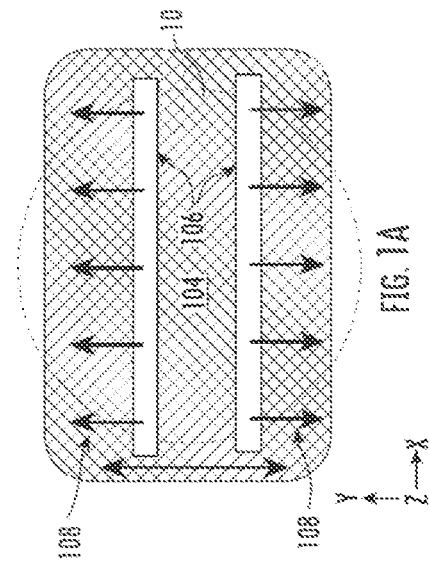
FIG. 1A shows a plan view of a variant of the extraction assembly of the processing apparatus of FIG. 1, in accordance with various embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, apparatuses, and systems including high angle extraction optics are disclosed in accordance with the present disclosure and with reference to the accompanying drawings, where embodiments are shown. The embodiments may be embodied in many different forms and are not to be construed as being limited to those set forth herein. Instead, these embodiments are provided so the disclosure will be thorough and complete, and will fully convey the scope of methods, systems, and devices to those skilled in the art.

In various embodiments, extraction optics, also referred to as extraction assemblies, are provided to generate high angle of incidence ("high angle") ion beams from a plasma-type ion source. Such extraction assemblies are suitable for use in compact ion beam processing apparatus, where a substrate is maintained in close proximity to a plasma chamber from which chamber an ion beam is extracted. The substrate may be located in a housing or processing chamber, adjacent the plasma chamber, and in communication with a plasma in the plasma chamber through the extraction assembly.

Figure 1:
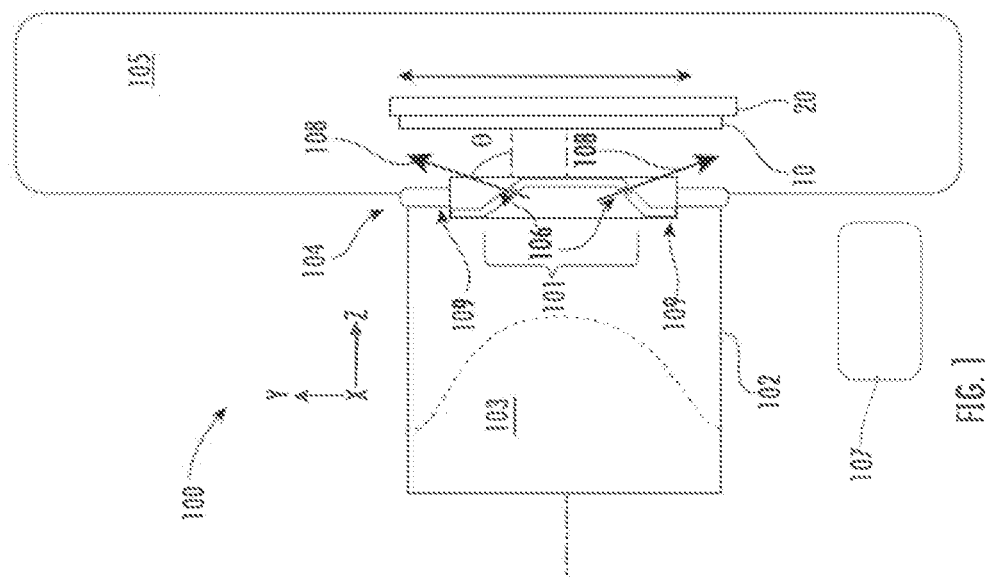
FIG. 1 shows a block diagram of a processing apparatus including a high angle extraction assembly in accordance with various embodiments of the disclosure.

FIG. 1 depicts a system or processing apparatus 100, in accordance with embodiments of this disclosure. The processing apparatus 100 includes a plasma source comprised of a plasma chamber 102 to generate a plasma 103 therein. The plasma chamber 102 may function as part of a plasma source such as an RF inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment, the plasma source is an ICP source where the power is coupled into the plasma through an RF generator—matching network tandem (not shown). The transfer of the RF power from the RF generator to the gas atoms and/or molecules takes places through an antenna and a dielectric window (not shown).

As known in the art, a gas manifold (not shown) may be connected to the plasma chamber 102 through appropriate gas lines and gas inlets. The plasma chamber 102 or other components of the processing apparatus 100 also may be connected to a vacuum system (not shown), such as a turbo molecular pump backed by a rotary or membrane pump. The plasma chamber 102 is defined by chamber walls, and may be arranged adjacent to a process chamber 105, electrically insulated from the plasma chamber 102. The process chamber 105 may include a substrate holder 20 and the wafer or substrate 10.

In some embodiments, the plasma chamber 102 may be biased with respect to the process chamber 105 using a bias voltage supply 107. For example, the plasma chamber 102 may be held at elevated voltage, such as +1000 V, while the substrate 10, the substrate holder 20, and process chamber 105 are grounded. Alternatively, a substrate 10, the substrate holder 20 may be held at negative potential, while the plasma chamber 102 and processing chamber 105 are grounded. The processing apparatus 100 may include an extraction assembly 104, having a pair of extraction apertures, shown as extraction apertures 106. The extraction assembly 104 may be arranged along a side of the plasma chamber 102, which side is arranged parallel to the X-Y plane in the Cartesian coordinate system shown. The extraction apertures 106 and other embodiments of extraction apertures to follow may form an elongated aperture(s), having a long axis extending along a first direction, in this case, along the X-axis. In other words, the extraction apertures 106 may be narrow along one direction, such as on the order of a few millimeters, several millimeters, or so, while elongated along a second direction, such as on the order of tens of centimeters. In these scenarios, positive ions may be extracted from the plasma 103 and directed to the substrate 10 at an ion energy proportionate to the difference in voltage between the plasma chamber 102 and the process chamber 105, or, in an alternative electrical biasing configuration, between the plasma and substrate-holder assembly (substrate 10 and substrate holder 20).

The extraction assembly 104 is arranged with an extraction plate that has a non-planar shape and includes a peripheral portion, or peripheral portions 109, for coupling to the plasma chamber 102. In this embodiment, and in embodiments to follow, a central portion 101 of the extraction plate of the extraction assembly 104 has a non-planar shape that is arranged to generate a high angle ion beam or set of high angle ion beams. In particular, the extraction assembly 104 is arranged as an extraction plate having a "convex bimodal" configuration, including the extraction apertures 106, generating a set of ion beams, where the ion beams 108 point away from one another. The extraction apertures 106 are arranged at locations on the convex plate such that the ion beams 108 define a high angle of incidence ($\theta$) with respect to a perpendicular to a plane of the substrate 10. Examples of suitable values for $\theta$ are values that may be referred to as high angles of incidence such as above 45 degrees, and in particular, between 50 degrees and 85 degrees according to various non-limiting embodiments. In the example of FIG. 1, a bimodal incidence of ions is provided with the angles of the two different ion beams, shown as ion beams 108, defined by $+/-\theta$, suitable, for example for treating two opposing sidewalls of a surface feature. The ion beams 108 are also extracted from a central region of the plasma chamber 102, where ion density may be higher as indicated by the dashed curve within the plasma chamber 102 representing the plasma density vertical profile which profile may have a parabolic-like shape. Because the ion beams 108 point away from one another, the different ion beams 108 will instantly impinge upon the substrate 10 at two different locations that are widely separated from one another, so a larger travel for substrate 10 may be needed to intercept both ion beams 108 across an entirety of the substrate 10.

As shown in FIG. 1, the processing apparatus 100 may include a substrate holder, shown as substrate stage 20, movable along a first direction, parallel to the side (X-Y plane) of the plasma chamber 102. In the example, shown, the substrate holder 20 may be movable along the Y-axis. As such, the substrate 10 may be scanned along the Y-axis to intercept the ion beams 108, so that most or all portions of the substrate 10 are treated by both of the ion beams 108.

FIG. 8 shows the geometry of high angle of incidence treatment of a surface feature by an ion beam. This figure illustrates that at high angles of incidence (70 degrees is shown in this example, the flux of ions (where flux may indicate the number of ions arriving at a surface per unit area per unit time) of an ion beam 400 on the sidewalls of mask 402 is much higher than the flux over the top surface of the mask 402. Thus, such a geometry may be suitable for applications where ion treatment of the sidewalls of a feature, such as etching of the sidewalls, is favored over treatment of the top surface. More quantitatively, the dose rate along a vertical surface is $\tan \theta$ times the dose rate along a horizontal surface which relationship means that as the etch process progresses the etch depth along the horizontal direction ($\Delta h$) exceeds the etch depth along the vertical direction ($\Delta v$), when $\theta$ exceeds 45 degrees. Examples of values of $\tan \theta$ are provided in table I.

TABLE I

| $\theta(°)$ | $\tan\theta$ |
| --- | --- |
| 50 | 1.2 |
| 55 | 1.4 |
| 60 | 1.7 |
| 65 | 2.1 |
| 70 | 2.7 |
| 75 | 3.7 |
| 80 | 5.7 |
| 85 | 11.4 |

Figure 2A:
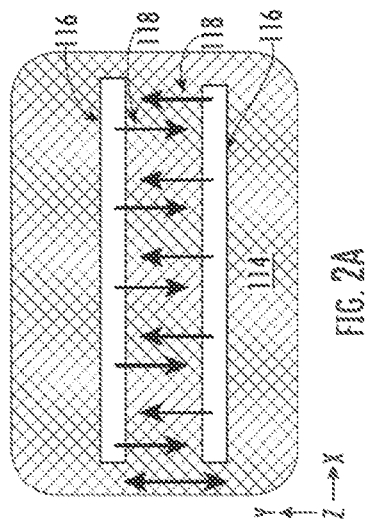
FIG. 2A shows a plan view of a variant of the extraction assembly of the processing apparatus of FIG. 2, in accordance with various embodiments of the disclosure.
Figure 2:
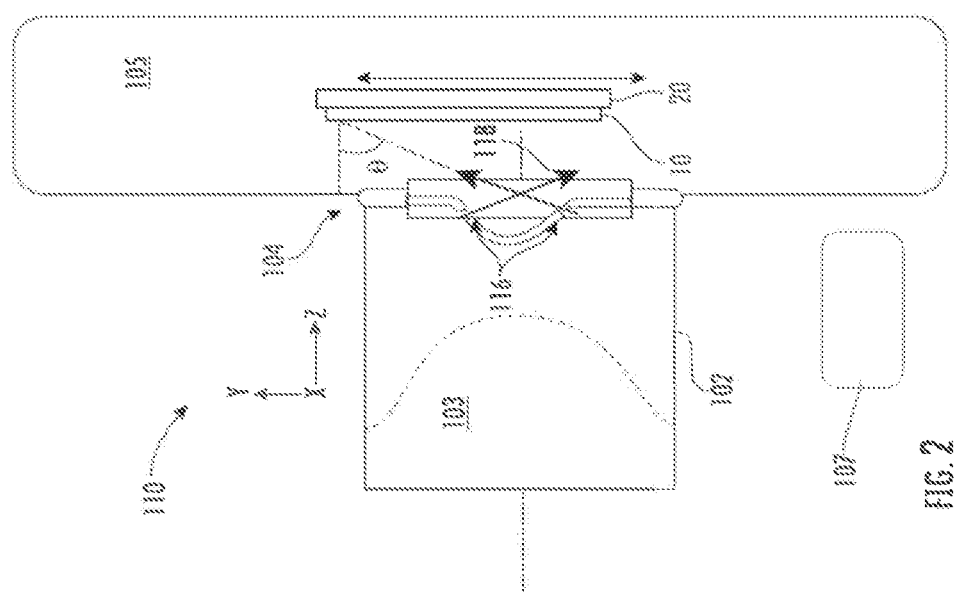
FIG. 2 shows a block diagram of another processing apparatus including another high angle extraction assembly in accordance with various embodiments of the disclosure.

FIG. 2 shows a block diagram of another processing apparatus including another high angle extraction assembly in accordance with various embodiments of the disclosure. In this example, the processing apparatus 110 shares similar components as processing apparatus 100, where like components are labeled the same. The processing apparatus 110 differs from the processing apparatus 100 in the extraction assembly 114. The extraction assembly 114 is formed from an extraction plate having a "concave bimodal" configuration, including the extraction apertures 116, generating a set of ion beams, where the ion beams 118 point toward one another. The extraction apertures 116 are arranged at locations on the convex plate such that the ion beams 118 also define a high angle of incidence ($\theta$) with respect to a perpendicular to a plane of the substrate 10. Examples of suitable values for $\theta$ are between 50 degrees and 85 degrees according to various non-limiting embodiments. In the example of FIG. 2, a bimodal incidence of ions is provided with the angles of the two different ion beams, both shown as ion beams 118, defined by +/−$\theta$. The ion beams 118 are also extracted from a central region of the plasma chamber 102, where ion density may be higher as indicated by the dashed curve within the plasma chamber 102 which curve depicts the parabolic-like plasma density vertical profile. Because the ion beams 118 point toward one another, the different ion beams 118 will cross one another before they impinge upon the substrate 10.

Figure 3A:
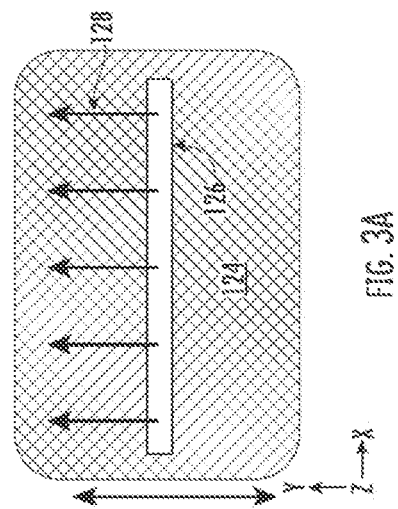
FIG. 3A shows a plan view of a variant of the extraction assembly of the processing apparatus of FIG. 3, in accordance with various embodiments of the disclosure.
Figure 3:
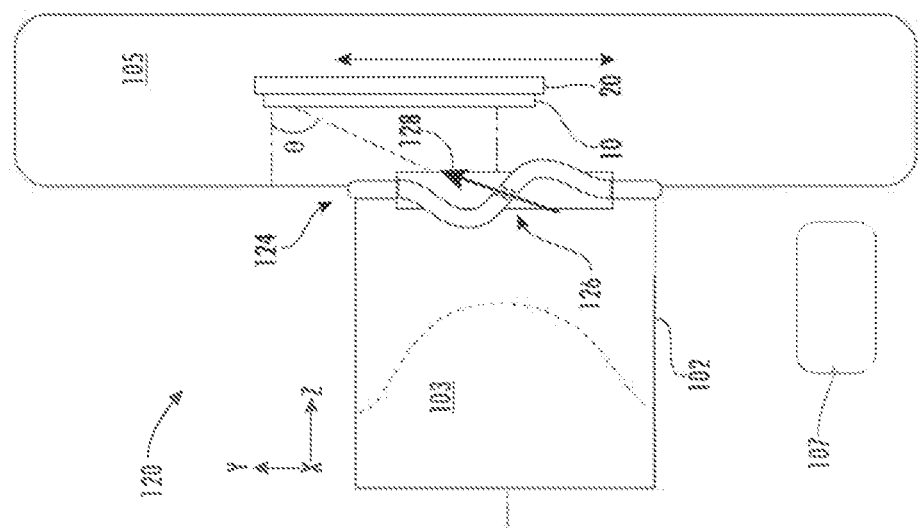
FIG. 3 shows a block diagram of a further processing apparatus including a further high angle extraction assembly in accordance with various embodiments of the disclosure.

FIG. 3 shows a block diagram of a further processing apparatus including a further high angle extraction assembly in accordance with various embodiments of the disclosure. In this example, the processing apparatus 120 shares similar components as processing apparatus 100, where like components are labeled the same. The processing apparatus 120 differs from the processing apparatus 100 in the extraction assembly 124. The extraction assembly 124 is formed from a "unimodal" extraction plate including the aperture 126, generating a single ion beams, where the ion beam 128 is formed from an extraction apertures 126 are arranged at an angled portion of an S-shaped extraction plate such that the ion beams 128 also defines a high angle of incidence ($\theta$) with respect to a perpendicular to a plane of the substrate 10. Examples of suitable values for $\theta$ are between 50 degrees and 85 degrees according to various non-limiting embodiments.

This design is appropriate for treating just one sidewall or side of a surface feature in particular. However, provided with substrate rotation, multiple sides of a surface feature may be treated by rotating the substrate 10 between vertical scans of the substrate 10.

Figure 4A:
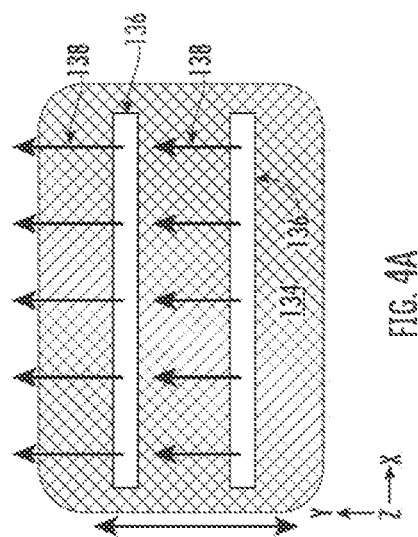
FIG. 4A shows a plan view of a variant of the extraction assembly of the processing apparatus of FIG. 14, in accordance with various embodiments of the disclosure.
Figure 4:
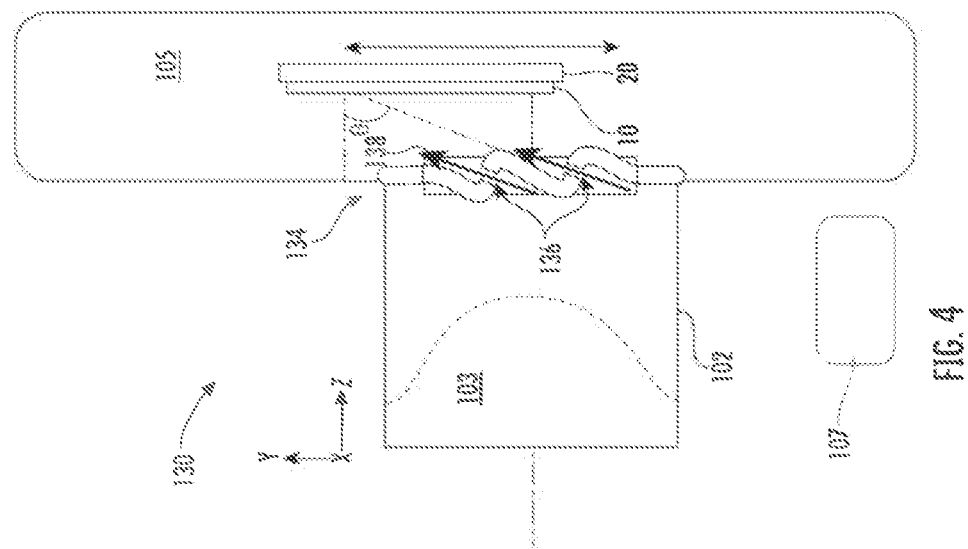
FIG. 4 shows a block diagram of an additional processing apparatus including an additional high angle extraction assembly in accordance with various embodiments of the disclosure.

FIG. 4 shows a block diagram of an additional processing apparatus including an additional high angle extraction assembly in accordance with various embodiments of the disclosure. In this example, the processing apparatus 130 shares similar components as processing apparatus 100, where like components are labeled the same. The processing apparatus 130 differs from the processing apparatus 100 in the extraction assembly 134. The extraction assembly 134 is formed from a "multibeam up" extraction plate including the extraction apertures 136, generating multiple ion beams, where the ion beams 138 are formed from an extraction apertures 136 and are arranged at angled portions of a multiple-S-shaped extraction plate such that the ion beams 138 also define a high angle of incidence ($\theta$) with respect to a perpendicular to a plane of the substrate 10. Examples of suitable values for $\theta$ are between 50 degrees and 85 degrees according to various non-limiting embodiments.

This design is appropriate for treating just one sidewall or side of a surface feature in particular. However, provided with substrate rotation, multiple sides of a surface feature may be treated by rotating the substrate 10 between scans of the substrate 10. An advantage of this design is that higher ion flux is achieved by providing multiple apertures. While just two apertures are shown, in other embodiments, three or more apertures may be used.

FIG. 1A shows a plan view of a variant of the extraction assembly of the processing apparatus of FIG. 1, in accordance with various embodiments of the disclosure. FIG. 2A shows a plan view of a variant of the extraction assembly of the processing apparatus of FIG. 2, in accordance with various embodiments of the disclosure. FIG. 3A shows a plan view of a variant of the extraction assembly of the processing apparatus of FIG. 3, in accordance with various embodiments of the disclosure. FIG. 4A shows a plan view of a variant of the extraction assembly of the processing apparatus of FIG. 14, in accordance with various embodiments of the disclosure. In each embodiment of these embodiments, the respect extraction apertures, discussed above, are elongated along the X-axis, so as to extend across an entirety of a substrate 10. In this manner, an ion beam or set of ion beams generated by the extraction apertures as shown in FIGS. 1A-4A, may define a ribbon beam whose width extends to a beam width along the X-direction that is adequate to expose an entire width of the substrate 10, even at the widest part along the X-direction. Exemplary extraction aperture widths for these embodiments may be in the range of 10 cm, 20 cm, 30 cm, 45 cm or more, while exemplary beam lengths along the Y-direction may be in the range of 3 mm, 5 mm, 10 mm, or 20 mm. The embodiments are not limited in this context.

In various additional embodiments of the disclosure, the aforementioned extraction assembly designs of the apparatus of FIGS. 1-4 may be modified by modifying a metal extraction plate so that a portion of the extraction plate is an insulator. In other embodiments of the disclosure the aforementioned extraction assembly designs of the apparatus of FIGS. 1-4 may be modified by adding one or more steering electrodes in addition to an extraction electrode. In still further embodiments of the disclosure, the aforementioned extraction assembly designs of the apparatus of FIGS. 1-4 may be modified by adding an additional electrode, similar in shape to a first extraction electrode.

Figure 5:
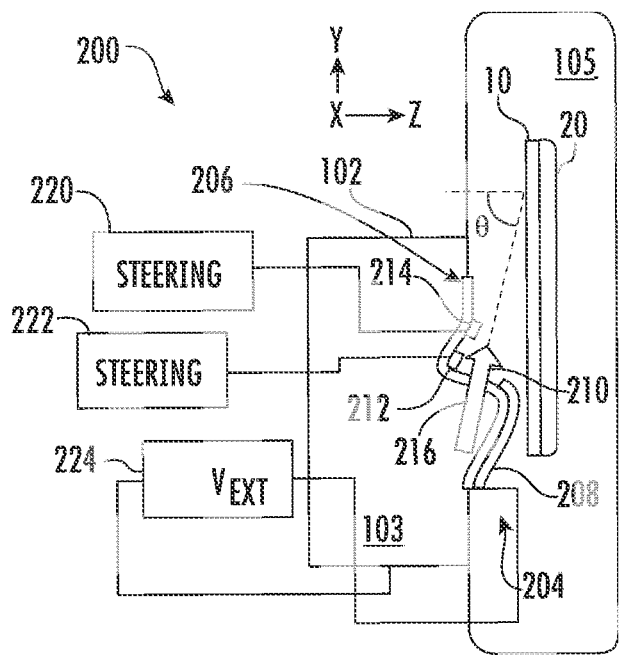
FIG. 5 shows a block diagram of still another processing apparatus including a high angle extraction assembly in accordance with various embodiments of the disclosure.

FIG. 5 depicts a system or processing apparatus 200, in accordance with embodiments of this disclosure. The processing apparatus 200 includes a plasma source comprised of a plasma chamber 102 to generate a plasma 103 therein. The plasma chamber 102 may function as discussed previously. In this example, an extraction assembly 204 is provided having a general shape similar to the S-shape extraction electrode of FIG. 3. The extraction assembly 204 differs from the extraction assembly 124 in that an extraction plate is formed of a dielectric, shown as an S-shaped insulator body 206, such as a ceramic, facing the plasma chamber 102. The S-shaped insulator body 206 is coated with a conductive layer 208, facing the substrate 10, which layer may be applied to the S-shaped insulator body 206 after fabrication of the S-shaped insulator body 206. An extraction voltage supply 224 is provided to bias the plasma chamber 102 with respect to the conductive layer 208 or vice versa. For example, the conductive layer 208 and substrate 10 and substrate holder 20 may be grounded, while +1000 V is applied to the plasma chamber 102 or, in an alternative electrical configuration, the conductive layer 208 and substrate-substrate holder assembly (10,20) may be biased at −1000 V whereas the plasma chamber 102 and the processing chamber 105 are grounded. Thus, a strong electric field develops across the thickness of the S-shape insulator body 206, which thickness may be on the order of several millimeters, one centimeter, or so. More importantly, this electric field extends in the area of the extraction slit 216. In this fashion, this field may more accurately control a high angle ion beam 210 extracted through an aperture provided in the extraction assembly 204.

Figure 6:
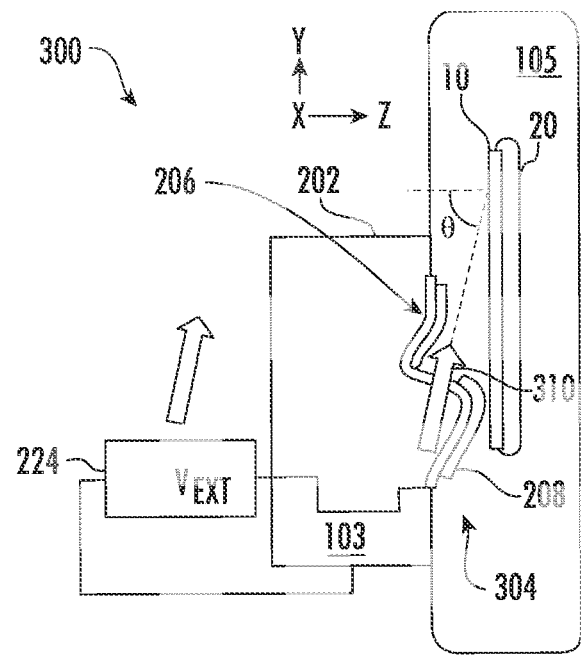
FIG. 6 shows a block diagram of one additional processing apparatus including another high angle extraction assembly in accordance with various embodiments of the disclosure.

The extraction assembly 204 may further include one or more steering electrodes, arranged, for example, on or near the outer surface of the S-Shaped insulator body 206. A steering electrode 212 and a steering electrode 214 are shown for purposes of illustration. In the example where the conductive layer is grounded while the plasma chamber 102 is held at +1000 V, the steering electrodes may be biased at potentials close to ground, but different from ground, such as between +/−100 V, +/−200 V, to provide extra control of an extracted ion beam, such as high angle ion beam 210. The steering electrodes may be independently biased, as shown in FIG. 5, where a steering voltage supply 220 is coupled to the steering electrode 214, and a steering voltage supply 222 is coupled to a steering electrode 212. This fine control may be especially useful for controlling focusing and collimation of the high angle ion beam 210, where accurate control of the exact angle of incidence is called for. For example, as shown in Table I, for a nominal angle of incidence of 75 degrees, a change of angle of 5 degrees+/− may result in tan $\theta$ varying between a value of 2.7 and 5.7, and consequently proportional variation in the ratio of ion flux on vertical surfaces to ion flux on horizontal surfaces. However, in some embodiments having an extraction electrode formed of an insulator that is coated with a conductive layer, the steering electrodes may be omitted. FIG. 6 provides an example of a processing apparatus 300 where the extraction assembly 304 is formed of an S-shaped insulator body 206 coated with a conductive layer 208, with no steering electrodes, to extract an ion beam 310.

Note that in other embodiments, extraction assemblies may be formed having conductive-layer-coated-insulators having the shapes of the extraction assemblies of FIGS. 2-4, with or without steering electrodes, where the same general principles and operation apply as discussed with respect to FIG. 5.

FIG. 7 shows a block diagram of one additional processing apparatus 250, including an additional high angle extraction assembly in accordance with various embodiments of the disclosure. In this figure, the plasma chamber 102 and process chamber 105 are omitted for clarity. An extraction assembly 254 is provided, including an interior extraction plate 256 and exterior extraction plate 258. These extraction plates are somewhat complex in shape having a concave portion and two planar portions that are offset from one another with respect to the distance to the substrate 10 (which distance may be on the order of a few millimeters to a few centimeters in this embodiment and other embodiments of the disclosure). A first extraction aperture 260 is arranged on a steeply angled portion of the interior extraction plate 256, while a second extraction aperture 266 is arranged on a steeply angled portion of the exterior extraction plate 258, and is aligned with the first extraction aperture 260. An extraction voltage (such as 1000 V) is applied between the interior extraction plate 256 and the exterior extraction plate 258 to extract an angled ion beam 268 at a suitable angle, such as 50-85 degrees in various non-limiting embodiments.

Like the embodiments discussed with respect to FIG. 5, the extraction assembly 254 may further include one or more steering electrodes. In the example of FIG. 7, a steering electrode 262 is provided, adjacent the exterior extraction plate 258, and facing the substrate 10. The steering electrode 262 may be mechanically anchored to the exterior extraction plate 258 using an insulator 264, which component electrically isolates the steering electrode 262 from the exterior extraction plate 258. As such, a steering voltage supply 220 is provided to independently bias the steering electrode 262, to provide further control of the ion beam 268, as generally discussed with respect to FIG. 5.

Note that in the aforementioned embodiments, the apertures shown, and therefore the ion beams, may be elongated into the plane of the figures, so as to generate ribbon ion beams that may extend across the entire width or diameter of a substrate.

In sum, the present embodiments provide novel apparatus and extraction assemblies that are generally arranged with one or more extraction plates having novel, non-planar geometries to provide extracted ion beams an high angles of incidence.

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present embodiments provide at least the following advantages. Novel apparatus and extraction assemblies that are generally arranged with one or more extraction plates provide extracted ion beams an high angles of incidence, allowing preferential ion treatment of substrate surfaces that are oriented at such high angles. Another advantage provided by certain embodiments having multiple extraction apertures is the ability to increase ion flux for high angle ions, and to increase substrate processing throughput accordingly. A further advantage provided by additional embodiments is the ability to treat oppositely-oriented substrate surfaces with high angle ions simultaneously using multi-aperture extraction assemblies having extraction apertures oriented in opposing directions to one another.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A processing system, comprising:
a plasma chamber operable to generate a plasma; and
an extraction assembly, arranged along a side of the plasma chamber, the extraction assembly comprising:
an extraction plate including an extraction aperture, the extraction plate having a non-planar shape, and generating an extracted ion beam at a high angle of incidence with respect to a perpendicular to a plane of a substrate, when the plane of the substrate is arranged parallel to the side of the plasma chamber,
wherein the high angle of incidence has a value between 45 degrees and 85 degrees.

2. The processing system of claim 1, the extraction plate defining a convex bimodal configuration, wherein the extraction aperture is a first extraction aperture, defining a first angle of incidence with respect to the perpendicular, the extraction plate further comprising a second extraction aperture, defining a second angle of incidence with respect to the perpendicular, opposite the first angle of incidence.

3. The processing system of claim 1, wherein the extraction plate defines a concave bimodal configuration, wherein the extraction aperture is a first extraction aperture, defining a first angle of incidence with respect to the perpendicular, the extraction plate further comprising a second extraction aperture, defining a second angle of incidence with respect to the perpendicular, opposite the first angle of incidence.

4. The processing system of claim 1, the extraction plate comprising at least one elongated aperture, having a long axis extending along a first direction.

5. The processing system of claim 1, comprising a substrate stage, movable along a first direction, parallel to the side of the plasma chamber.

6. A processing system, comprising:
a plasma chamber operable to generate a plasma; and
an extraction assembly, arranged along a side of the plasma chamber, the extraction assembly comprising:
an extraction plate including an extraction aperture, the extraction plate having a non-planar shape, and generating an extracted ion beam at a high angle of incidence with respect to a perpendicular to a plane of a substrate, when the plane of the substrate is arranged parallel to the side of the plasma chamber,
the extraction plate defining an S-shape.

7. The processing system of claim 6, the extraction plate comprising a plurality of S-shapes, wherein the extraction aperture is a first extraction aperture, defining a first angle of incidence with respect to the perpendicular, the extraction plate further comprising a second extraction aperture, defining a second angle of incidence with respect to the perpendicular, similar to or the same as the first angle of incidence.

8. The processing system of claim 6, wherein the extraction plate comprises:
an S-shaped insulator body; and
a conductive layer, disposed on an outer surface of the S-shaped insulator body.

9. A processing system, comprising:
a plasma chamber operable to generate a plasma; and
an extraction assembly, arranged along a side of the plasma chamber, the extraction assembly comprising:
an extraction plate including an extraction aperture, the extraction plate having a non-planar shape, and generating an extracted ion beam at a high angle of incidence with respect to a perpendicular to a plane of a substrate, when the plane of the substrate is arranged parallel to the side of the plasma chamber,
wherein the extraction plate comprises an interior extraction plate, the extraction assembly further comprising an exterior extraction plate, offset from the plasma chamber, wherein the extraction aperture comprises a first extraction aperture, disposed in the interior extraction plate, and wherein a second extraction aperture is disposed in the exterior extraction plate, and is aligned with the first extraction aperture.

10. The processing system of claim 9, wherein the first extraction aperture and the second extraction aperture define a same angle of incidence with respect to the perpendicular.

11. The processing system of claim 9, further comprising a steering electrode disposed on an outer surface of the exterior extraction plate.

12. The processing system of claim 9, further comprising a steering electrode, disposed outside of the exterior extraction plate.

13. An extraction assembly for directing an angled ion beam to a substrate, comprising:
an extraction plate, comprising:
a peripheral portion to couple to a side of a plasma chamber; and
a central portion, the central portion having a non-planar shape, and including an elongated extraction aperture arranged to generate an extracted ion beam at a high angle of incidence with respect to a perpendicular to a plane of the substrate, when the plane of the substrate is arranged parallel to the side of the plasma chamber,
wherein the high angle of incidence has a value between 45 degrees and 85 degrees.

14. The extraction assembly of claim 13, the elongated extraction plate defining a convex bimodal configuration, wherein the extraction aperture is a first extraction aperture, defining a first angle of incidence with respect to the perpendicular, the extraction plate further comprising a second extraction aperture, defining a second angle of incidence with respect to the perpendicular, opposite the first angle of incidence.

15. The extraction plate of claim 13, wherein the extraction plate defines a concave bimodal configuration, wherein the elongated extraction aperture is a first extraction aperture, defining a first angle of incidence with respect to the perpendicular, the extraction plate further comprising a second extraction aperture, defining a second angle of incidence with respect to the perpendicular, opposite the first angle of incidence.

16. An extraction assembly for directing an angled ion beam to a substrate, comprising:
an extraction plate, comprising:
a peripheral portion to couple to a side of a plasma chamber; and a central portion, the central portion having a non-planar shape, and including an elongated extraction aperture arranged to generate an extracted ion beam at a high angle of incidence with respect to a perpendicular to a plane of the substrate, when the plane of the substrate is arranged parallel to the side of the plasma chamber, the extraction plate defining an S-shape.

17. The extraction assembly of claim 16, the extraction plate comprising a plurality of S-shapes, wherein the elongated extraction aperture is a first extraction aperture, defining a first angle of incidence with respect to the perpendicular, the extraction plate further comprising a second extraction aperture, defining a second angle of incidence with respect to the perpendicular, similar to or the same as the first angle of incidence.

18. The extraction assembly of claim 16, wherein the extraction plate comprises:
    an S-shaped insulator body; and
    a conductive layer, disposed on an outer surface of the S-shaped insulator body.

19. An extraction assembly for directing an angled ion beam to a substrate, comprising:
    an extraction plate, comprising:
    a peripheral portion to couple to a side of a plasma chamber; and
    a central portion, the central portion having a non-planar shape, and including an elongated extraction aperture arranged to generate an extracted ion beam at a high angle of incidence with respect to a perpendicular to a plane of the substrate, when the plane of the substrate is arranged parallel to the side of the plasma chamber, wherein the extraction plate comprises an interior extraction plate, the extraction assembly further comprising an exterior extraction plate, offset from the plasma chamber, wherein the elongated extraction aperture comprises a first extraction aperture, disposed in the interior extraction plate, and wherein a second extraction aperture is disposed in the exterior extraction plate, and is aligned with the first extraction aperture.

20. The extraction assembly of claim 19, further comprising a steering electrode disposed on an outer surface of the exterior extraction plate, or disposed outside of the exterior extraction plate.

* * * * *